U S009022046B2

United States Patent
Machida

(10) Patent No.: US 9,022,046 B2
(45) Date of Patent: May 5, 2015

(54) SUBSTRATE PROCESSING APPARATUS AND SUBSTRATE PROCESSING METHOD FOR SUCCESSIVELY PROCESSING A PLURALITY OF SUBSTRATES

(75) Inventor: Eisaku Machida, Kyoto (JP)

(73) Assignee: Screen Holdings Co., Ltd. (JP)

( * ) Notice: Subject to any disclaimer, the term of this patent is extended or adjusted under 35 U.S.C. 154(b) by 27 days.

(21) Appl. No.: 13/365,731

(22) Filed: Feb. 3, 2012

(65) Prior Publication Data

US 2012/0143366 A1 Jun. 7, 2012

Related U.S. Application Data

(62) Division of application No. 12/369,882, filed on Feb. 12, 2009, now abandoned.

(30) Foreign Application Priority Data

Apr. 3, 2008 (JP) ................................. 2008-097113

(51) Int. Cl.
H01L 21/67 (2006.01)
H01L 21/677 (2006.01)
H01L 21/687 (2006.01)

(52) U.S. Cl.
CPC .... *H01L 21/67745* (2013.01); *H01L 21/67742* (2013.01); *H01L 21/67748* (2013.01); *H01L 21/68764* (2013.01); *H01L 21/68785* (2013.01)

(58) Field of Classification Search
CPC ................................................ H01L 21/67745
See application file for complete search history.

(56) References Cited

U.S. PATENT DOCUMENTS

| 5,498,294 A | 3/1996 | Matsushita et al. |
| 5,518,542 A | 5/1996 | Matsukawa et al. |
| 6,874,515 B2 | 4/2005 | Ishihara et al. |

(Continued)

FOREIGN PATENT DOCUMENTS

| CN | 101211757 | 7/2008 |
| JP | 2001-219391 | 8/2001 |

(Continued)

OTHER PUBLICATIONS

Korean Office Action received from the Korean Patent Office dated Sep. 25, 2012 for corresponding Korean application No. 10-2011-0097434.

(Continued)

*Primary Examiner* — Michael Barr
*Assistant Examiner* — Jason Riggleman
(74) *Attorney, Agent, or Firm* — Ostrolenk Faber LLP

(57) ABSTRACT

One of reverse passing parts provided in a substrate passing part comprises a first holding mechanism and a second holding mechanism. The first holding mechanism and the second holding mechanism are arranged in vertically symmetry with respect to a rotary central axis and rotate 180 degrees about the rotary central axis, to replace each other in position. A transport robot on the loading side passes a substrate to a third holding mechanism or a fourth holding mechanism at a first vertical position. The substrate reversed in the reverse passing part is passed to a transport robot on the unloading side from the third holding mechanism or the fourth holding mechanism at a second vertical position. Before a reverse process on the preceding substrate is finished, the transport robot on the loading side can start the transfer of the following substrate.

6 Claims, 11 Drawing Sheets

(56) References Cited

U.S. PATENT DOCUMENTS

| | | | |
|---|---|---|---|
| 6,893,171 | B2 | 5/2005 | Fukutomi et al. |
| 2002/0059686 | A1 | 5/2002 | Uemukai et al. |
| 2002/0157692 | A1 | 10/2002 | Ishihara et al. |
| 2005/0022325 | A1 | 2/2005 | Uemukai et al. |
| 2006/0045722 | A1 | 3/2006 | Hashimoto |
| 2008/0156351 | A1* | 7/2008 | Mitsuyoshi et al. ............ 134/15 |
| 2008/0156357 | A1* | 7/2008 | Mitsuyoshi ................... 134/133 |
| 2008/0199283 | A1 | 8/2008 | Mitsuyoshi |

FOREIGN PATENT DOCUMENTS

| | | |
|---|---|---|
| JP | 2002-110609 | 4/2002 |
| JP | 2004-241552 | 8/2004 |
| JP | 2004-327674 | 11/2004 |
| JP | 2005-093653 | 4/2005 |
| JP | 2006-12880 | 1/2006 |
| KR | 10-2007-0102373 | 12/2007 |

OTHER PUBLICATIONS

Japanese translation of Korean Office Action and English translation of Japanese translation of Korean Office Action.

Korean Office Action received from the Korean Patent Office dated Feb. 10, 2011 for corresponding Korean application No. 9-5-2011-007592562.

Japanese translation of Korean Office Action and partial English translation of Japanese translation of Korean Office Action corresponding Korean application No. 9-5-2011-007592562.

Korean Office Action received from the Korean Patent Office dated Aug. 3, 2011 for corresponding Korean application No. 10-2009-0016299.

Japanese translation of Korean Office Action and partial English translation of Japanese translation of Korean Office Action.

Korean Office Action dated Mar. 2, 2012 issued in connection with corresponding Korean application serial No. 10-2011-0097434.

Japanese translation of Korean Office action prepared by Japanese associate's Korean representative.

Partial English translation of Korean Office Action based on above-identified Japanese translation. Only the portion related to prior-art based rejection is translated.

Japanese Office Action mailed Jul. 24, 2012 in connection with corresponding Japanese Patent Application No. 2008-097113 and English translation thereof.

Korean Office Action received from the Korean Patent Office dated Aug. 5, 2011 for corresponding Korean application No. 10-2011-0042417.

Japanese translation of Korean Office Action and partial English translation of Japanese translation of Korean Office Action corresponding Korean application No. 10-2011-0042417.

Office Action received from Chinese Patent Office dated Mar. 9, 2010 in connection with Chinese application No. 2009-101302120, with English translation thereof.

* cited by examiner

FIG. 2
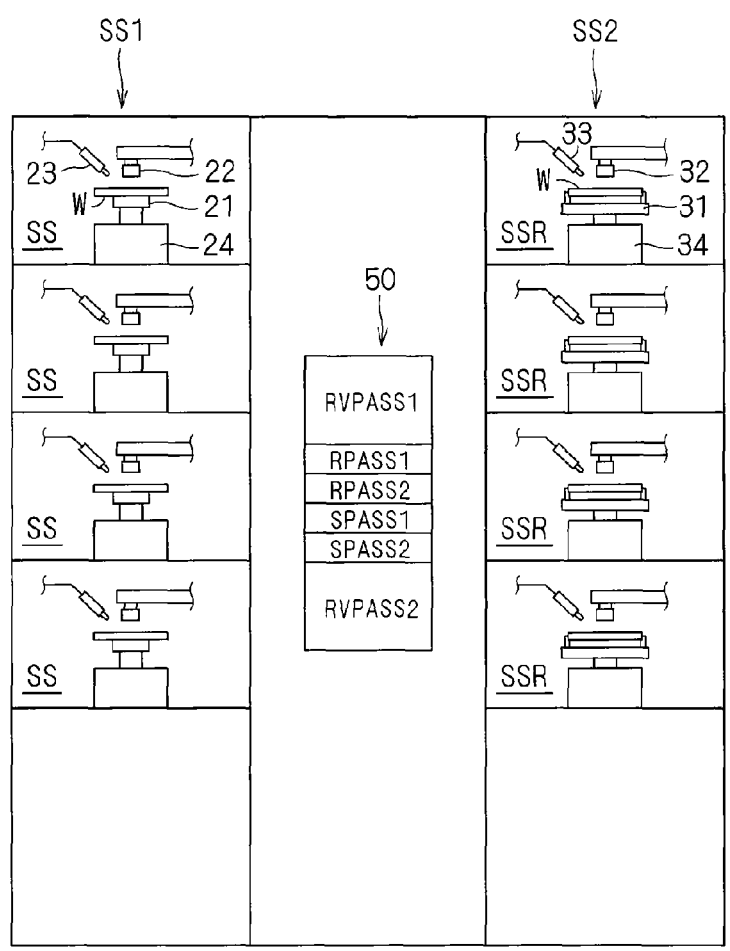
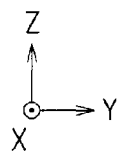

F I G . 4
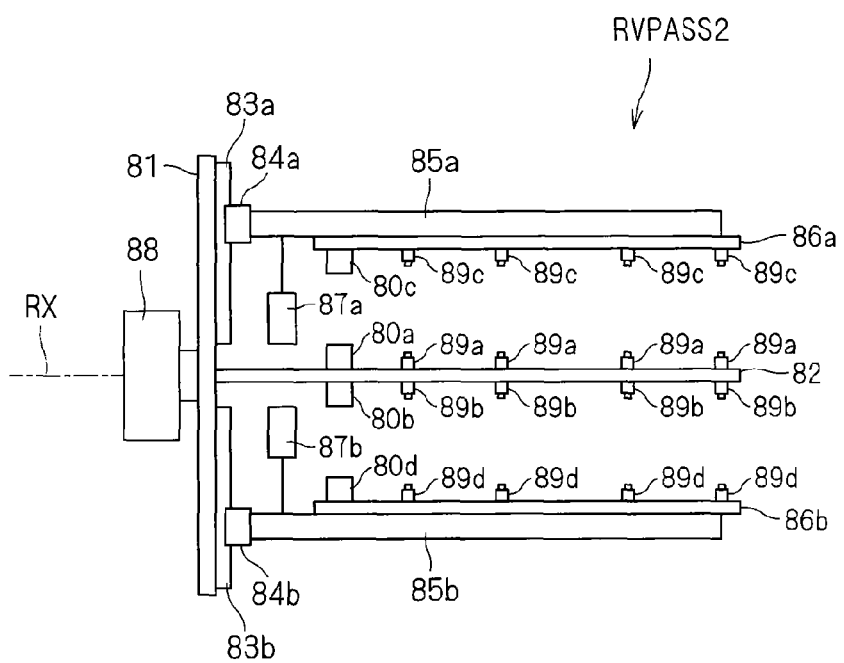

F I G. 7
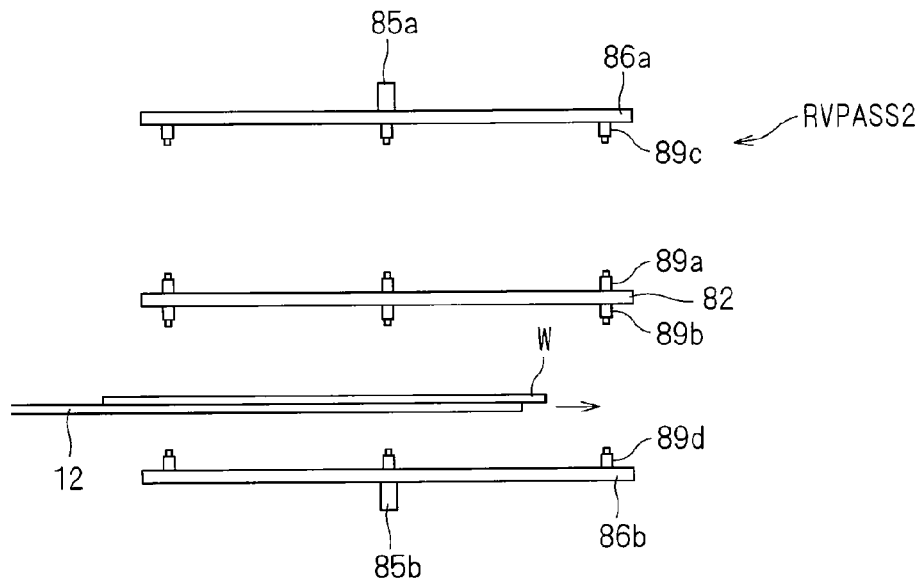
F I G. 8
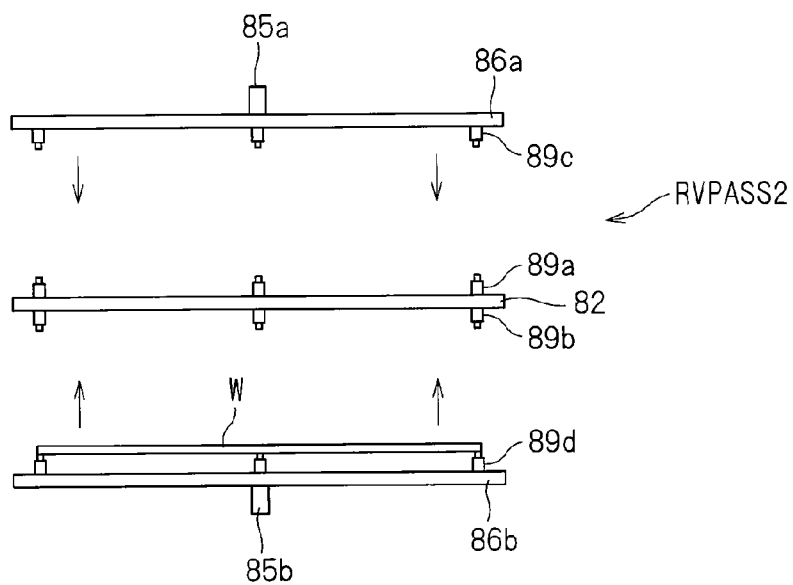

F I G. 9
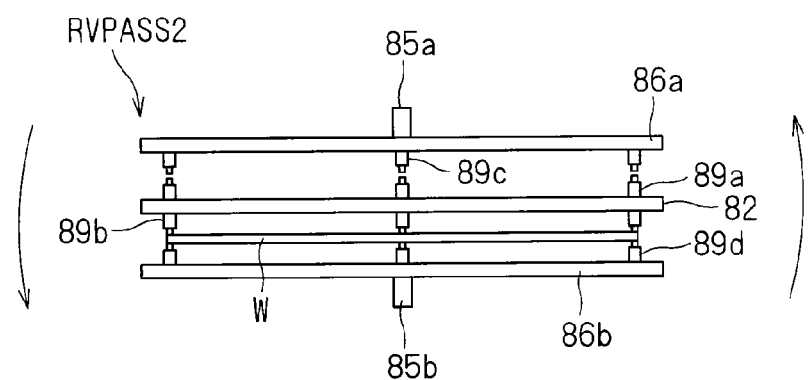
F I G. 10
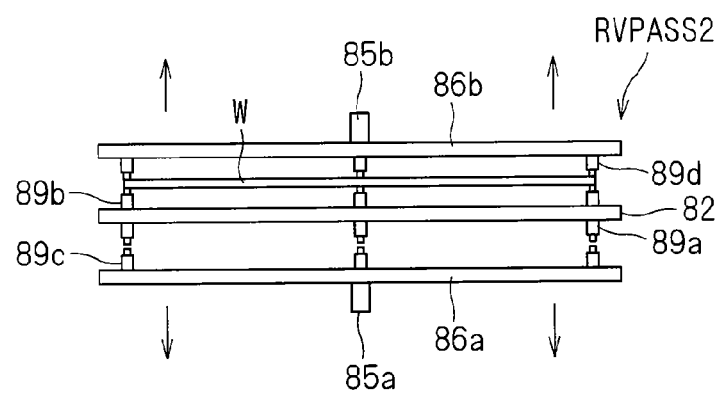

F I G. 1 1
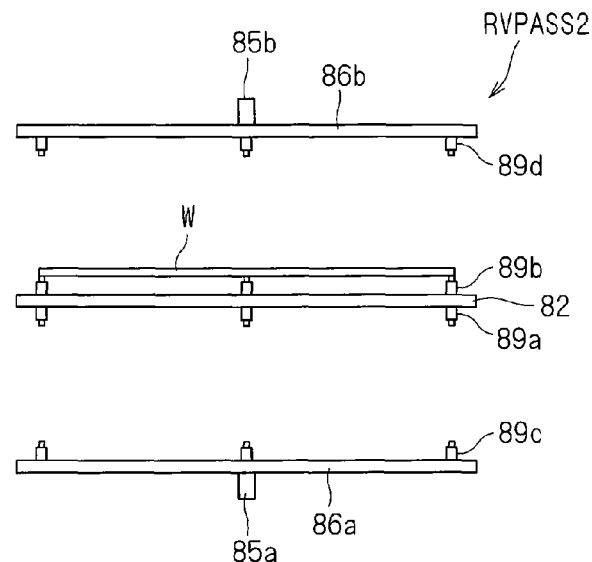
F I G. 1 2
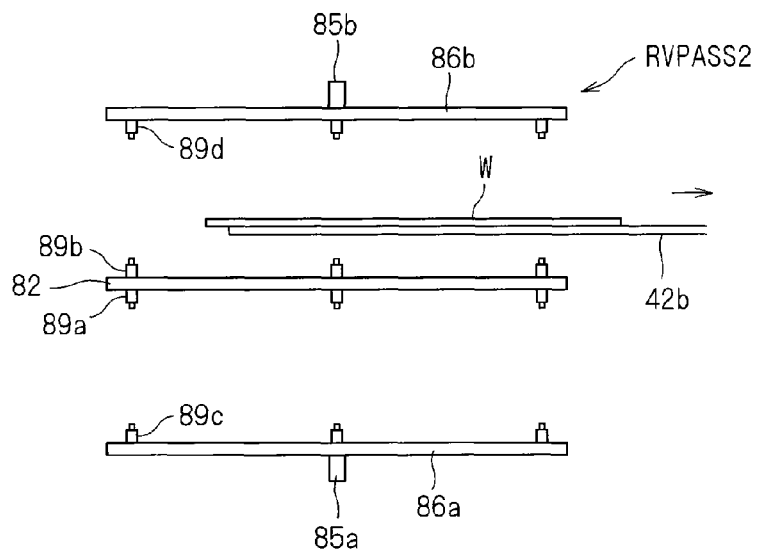

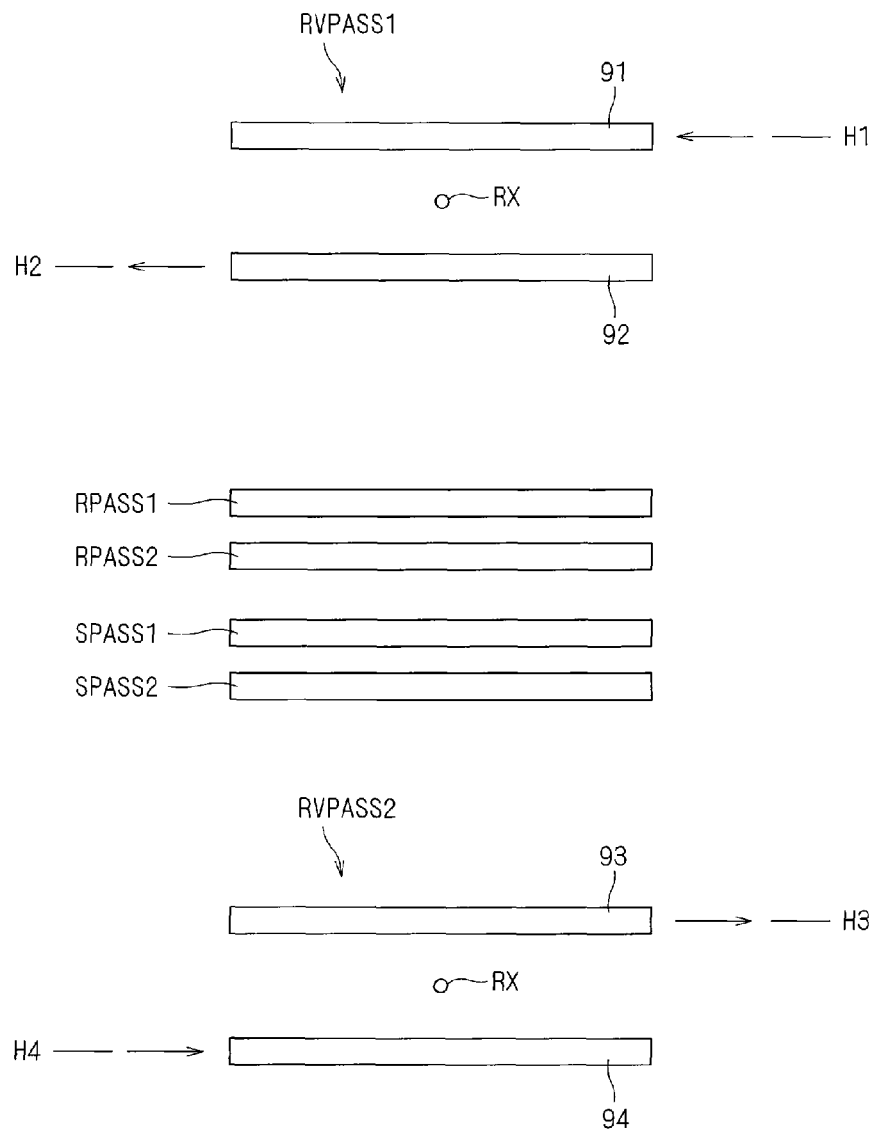

SUBSTRATE PROCESSING APPARATUS AND SUBSTRATE PROCESSING METHOD FOR SUCCESSIVELY PROCESSING A PLURALITY OF SUBSTRATES

CROSS REFERENCE TO RELATED APPLICATION

This application is a divisional of U.S. application Ser. No. 12/369,882, filed Feb. 12, 2009, by Eisaku MACHIDA, entitled SUBSTRATE PROCESSING APPARATUS AND SUBSTRATE PROCESSING METHOD FOR SUCCESSIVELY PROCESSING A PLURALITY OF SUBSTRATES which claims the benefit of Japanese Appln. S.N. JP2008-097113, filed Apr. 3, 2008, the contents of which are incorporated by this reference.

BACKGROUND OF THE INVENTION

1. Field of the Invention

The present invention relates to a substrate processing apparatus and a substrate processing method for successively processing a plurality of substrates, such as semiconductor substrates, glass substrates for liquid crystal display devices, glass substrates for photomasks, substrates for optical disks or the like.

2. Description of the Background Art

As well known, products such as semiconductors, liquid crystal displays or the like are manufactured by performing a series of processings including cleaning, resist coating, exposure, development, etching, formation of interlayer insulating films, thermal processing, dicing and the like on the above substrates. Generally, a substrate processing apparatus consists of processing units for performing these processings and transport robots for transporting the substrates to the processing units. For example, an apparatus consisting of a coating unit for performing a resist coating process on the substrates, a development unit for performing a development process on the substrates and a transport robot for transporting the substrates between these units is a so-called coater & developer, which is widely used.

As one exemplary substrate processing apparatus, Japanese Patent Application Laid Open Gazette No. 2005-93653, for example, discloses a coater & developer in which a plurality of cells are arranged in parallel, one of which is constituted of one transport robot and a plurality of processing units from/to which the transport robot transports substrates, and a substrate passing part is provided between the cells, to pass the substrates from/to the transport robots of the adjacent cells via the substrate passing part.

Though the apparatus disclosed in Japanese Patent Application Laid Open Gazette No. 2005-93653 is one for performing the resist coating process and the development process on substrates, it is possible to apply a like cell structure in which a plurality of cells are connected to one another via the substrate passing parts to devices for performing other types of processings, such as a cleaning device for cleaning substrates with a brush. Specifically, the cleaning device has a construction in which an indexer cell for accumulating unprocessed substrates and processed substrates and a cleaning cell provided with a brush cleaning unit are connected to each other via a substrate passing part. The indexer cell and the cleaning cell are provided with respective dedicated transport robots.

In the substrate processing apparatus having such a cell structure as discussed above, if the number of process steps performed in each cell becomes larger, the number of transporting processes using the transport robot increases and the transport becomes a rate-limiting factor. In order to solve this phenomenon, some sort of substrate processing is performed in the substrate passing part between the adjacent cells, to reduce the number of process steps to be performed in each cell. Specifically, the substrate passing part also has a function as a substrate processing part as well as the original function of passing substrates between the cells. In a cleaning device in which a brush cleaning unit is provided in a cell, for example, a process of reversing front and back sides of a substrate may be performed in the substrate passing part. Since the substrate processing which is conventionally performed in the cell is performed in the substrate passing part, the number of process steps to be performed in the cell decreases and the transport load of the transport robot is reduced.

There arises a new problem, however, that if the substrate passing part performs some sort of substrate processing, the transport robot can not load the next substrate into the substrate passing part, in other words, a transport operation for the next substrate can not be started until the substrate processing is finished. The simplest method to solve this problem is to increase the number of passing parts each of which also performs some sort of substrate processing, but since the reverse passing part which is a passing part for reversing front and back sides of a substrate has a large size, it is not easy to increase the number of stages for the passing parts for reasons of layout of the whole apparatus. If the vertical-direction operating range of either one of the transport robots which access the substrate passing part is limited, especially, it is very hard to configure a multistage structure of the reverse passing parts for reversing front and back sides of substrates.

SUMMARY OF THE INVENTION

The present invention is intended for a substrate processing apparatus for successively processing a plurality of substrates.

According to an aspect of the present invention, the substrate processing apparatus comprises a sending side section having a first transport robot, for sending a substrate, a receiving side section having a second transport robot, for receiving the substrate sent out from the sending side section, and a reverse passing part provided between the sending side section and the receiving side section, for reversing a front surface and a back surface of the substrate passed from the first transport robot and passing the substrate to the second transport robot, which comprises a first holding part for holding a substrate, a second holding part for holding a substrate, and a rotation driving mechanism for rotating the first holding part and the second holding part about a rotary central axis along a horizontal direction, and in the substrate processing apparatus of the present invention, the first holding part and the second holding part are provided in a symmetrical position with respect to the rotary central axis, the rotation driving mechanism is so configured as to rotate the first holding part and the second holding part so that these holding parts alternately replace each other between a first position and a second position, the first transport robot is so configured as to pass a substrate to the first holding part or the second holding part at the first position, and the second transport robot is so configured as to receive a reversed substrate from the first holding part or the second holding part at the second position.

Since the first transport robot can start transfer of the following substrate before a reverse process on the preceding substrate is finished, it is possible to reduce a standby time of the transport robot to a minimum while minimizing the number of reverse passing parts.

According to another aspect of the present invention, the substrate processing apparatus comprises a) a processing section having a transport robot and a processing part to which a substrate is transported by the transport robot, b) an indexer section having a transfer robot, for passing an unprocessed substrate to the processing section and receiving a processed substrate from the processing section, c) a first reverse passing part provided between the indexer section and the processing section, for reversing a front surface and a back surface of the unprocessed substrate passed from the transfer robot and passing the unprocessed substrate to the transport robot, which comprises c-1) a first holding part for holding a substrate, c-2) a second holding part for holding a substrate, and c-3) a first rotation driving mechanism for rotating the first holding part and the second holding part about a first rotary central axis along a horizontal direction, and d) a second reverse passing part provided between the indexer section and the processing section, for reversing a front surface and a back surface of the processed substrate passed from the transport robot and passing the processed substrate to the transfer robot, which comprises d-1) a third holding part for holding a substrate, d-2) a fourth holding part for holding a substrate, and d-3) a second rotation driving mechanism for rotating the third holding part and the fourth holding part about a second rotary central axis along a horizontal direction, and in the substrate processing apparatus of the present invention, the first holding part and the second holding part are provided in a symmetrical position with respect to the first rotary central axis, the third holding part and the fourth holding part are provided in a symmetrical position with respect to the second rotary central axis, the first rotation driving mechanism is so configured as to rotate the first holding part and the second holding part so that these holding parts alternately replace each other between a first position and a second position, the second rotation driving mechanism is so configured as to rotate the third holding part and the fourth holding part so that these holding parts alternately replace each other between a third position and a fourth position, the transfer robot is so configured as to pass an unprocessed substrate to the first holding part or the second holding part at the first position and as to receive a processed substrate from the third holding part or the fourth holding part at the third position, and the transport robot is so configured as to receive an unprocessed substrate from the first holding part or the second holding part at the second position and as to pass a processed substrate to the third holding part or the fourth holding part at the fourth position.

Since the transfer robot and the transport robot can each start transfer of the following substrate before a reverse process on the preceding substrate is finished, it is possible to reduce the standby time of the robots to a minimum while minimizing the number of reverse passing parts.

Preferably, the substrate processing apparatus further comprises e) a first rest part provided between the indexer section and the processing section, on which the unprocessed substrate passed from the transfer robot is rested to be passed to the transport robot, and f) a second rest part provided between the indexer section and the processing section, on which the processed substrate passed from the transport robot is rested to be passed to the transfer robot.

It is thereby also possible to transfer the substrates without any reverse process.

The present invention is also intended for a substrate processing method for successively transferring a plurality of substrates from a first transport robot of a sending side section which sends the substrates to a second transport robot of a receiving side section which receives the substrates via a reverse passing part for reversing a front surface and a back surface of a substrate.

According to an aspect of the present invention, the substrate processing method comprises the steps of a) passing a substrate to a first holding part of the reverse passing part at a first position by the first transport robot, b) receiving a substrate from a second holding part of the reverse passing part at a second position by the second transport robot, c) rotating the first holding part and the second holding part of the reverse passing part 180 degrees about a rotary central axis along a horizontal direction to move the first holding part to the second position and move the second holding part to the first position, d) passing a substrate to the second holding part at the first position by the first transport robot, e) receiving a substrate from the first holding part at the second position by the second transport robot, f) rotating the first holding part and the second holding part of the reverse passing part 180 degrees about the rotary central axis to move the first holding part to the first position and move the second holding part to the second position, and g) repeating the step a) to step f).

Since the first transport robot can start transfer of the following substrate before a reverse process on the preceding substrate is finished, it is possible to reduce the standby time of the transport robot to a minimum while minimizing the number of reverse passing parts.

The present invention is further intended for a substrate processing method for successively transferring a plurality of substrates between a transport robot of a processing section having a processing part and a transfer robot of an indexer section.

According to an aspect of the present invention, the substrate processing method comprises the steps of a) passing an unprocessed substrate to a first holding part of a first reverse passing part for reversing a front surface and a back surface of a substrate at a first position by the transfer robot, b) receiving an unprocessed substrate from a second holding part of the first reverse passing part at a second position by the transport robot, c) rotating the first holding part and the second holding part of the first reverse passing part 180 degrees about a first rotary central axis along a horizontal direction to move the first holding part to the second position and move the second holding part to the first position, d) passing an unprocessed substrate to the second holding part at the first position by the transfer robot, e) receiving an unprocessed substrate from the first holding part at the second position by the transport robot, f) rotating the first holding part and the second holding part of the first reverse passing part 180 degrees about the first rotary central axis to move the first holding part to the first position and move the second holding part to the second position, and g) repeating the step a) to step f).

Since the transfer robot can start transfer of the following unprocessed substrate before a reverse process on the preceding unprocessed substrate is finished, it is possible to reduce a standby time of the transfer robot to a minimum while minimizing the number of reverse passing parts.

Preferably, the substrate processing method further comprises the steps of h) receiving a processed substrate from a third holding part of a second reverse passing part for reversing a front surface and a back surface of a substrate at a third position by the transfer robot, i) passing a processed substrate to a fourth holding part of the second reverse passing part at a fourth position by the transport robot, j) rotating the third holding part and the fourth holding part of the second reverse passing part 180 degrees about a second rotary central axis along a horizontal direction to move the third holding part to the fourth position and move the fourth holding part to the third position, k) receiving a processed substrate from the fourth holding part at the third position by the transfer robot, l) passing a processed substrate to the third holding part at the fourth position by the transport robot, m) rotating the third holding part and the fourth holding part of the second reverse passing part 180 degrees about the second rotary central axis to move the third holding part to the third position and move the fourth holding part to the fourth position, and n) repeating the step h) to step m).

Since the transport robot can start transfer of the following processed substrate before a reverse process on the preceding processed substrate is finished, it is possible to reduce the standby time of the transport robot to a minimum while minimizing the number of reverse passing parts.

Therefore, it is an object of the present invention to reduce a standby time of a robot to a minimum while minimizing the number of reverse passing parts.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a view showing the substrate processing apparatus, taken along the line A-A of FIG. 1;

FIG. 4 is a side elevation showing a reverse passing part;

FIGS. 7 to 12 are illustrations of an operation for transferring a substrate via the reverse passing part; and FIGS. 13 and 14 are illustrations of a concept of transferring a substrate via the reverse passing part.

DESCRIPTION OF THE PREFERRED EMBODIMENTS

Hereinafter, detailed discussion will be made on the preferred embodiment of the present invention with reference to figures.

Figure 1:
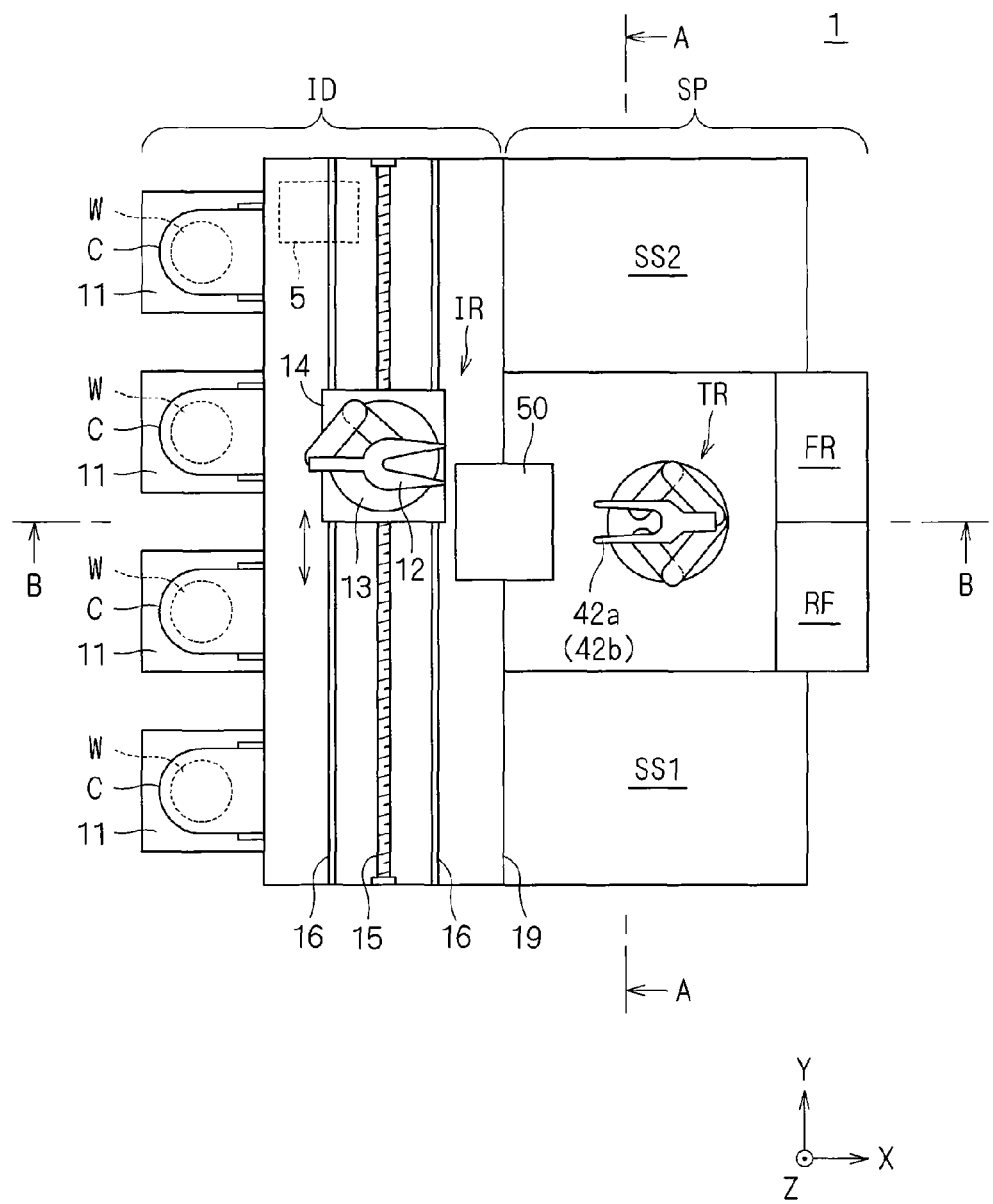
FIG. 1 is a plan view showing a substrate processing apparatus in accordance with the present invention.
Figure 3:
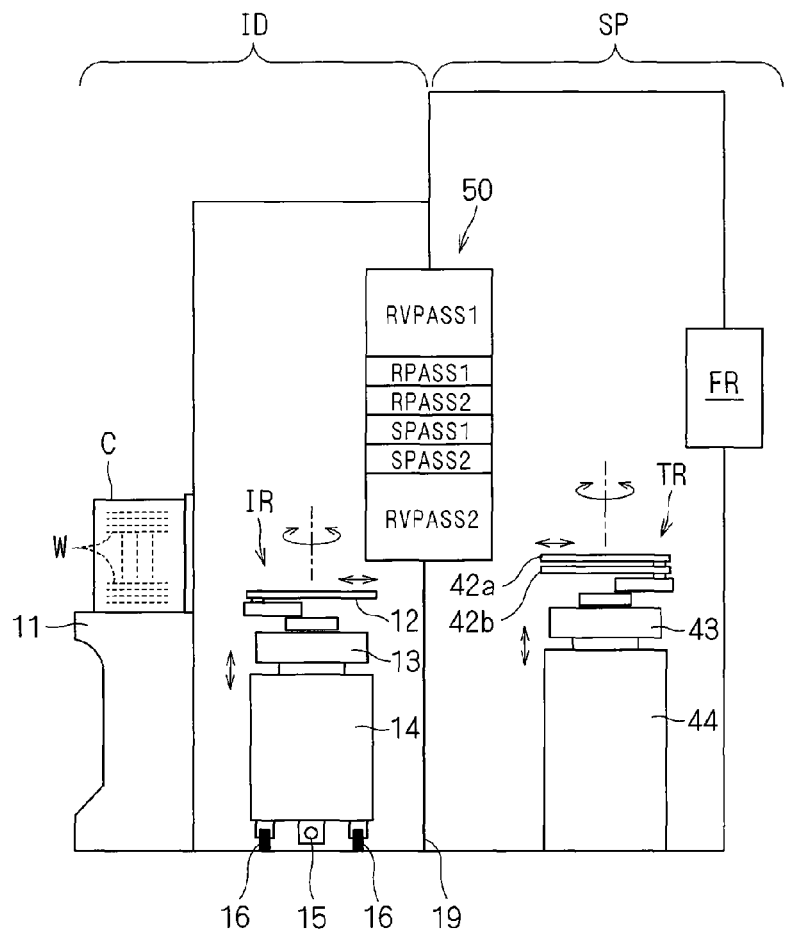
FIG. 3 is a view showing the substrate processing apparatus, taken along the line B-B of FIG. 1.

FIG. 1 is a plan view showing a substrate processing apparatus 1 in accordance with the present invention. FIG. 2 is a view taken along the line A-A of FIG. 1 and FIG. 3 is a view taken along the line B-B of FIG. 1. In FIGS. 1 to 3, an XYZ rectangular coordinate system in which the Z-axis direction is defined as the vertical direction and the XY plane is defined as the horizontal plane is additionally shown for the purpose of clarifying the directional relationship therebetween. The substrate processing apparatus 1 is a cleaning device for performing a scrub cleaning process successively on a plurality of substrates W such as semiconductor wafers or the like, in which two cells (processing sections), i.e., an indexer cell ID and a cleaning cell SP, are arranged in parallel. The substrate processing apparatus 1 further comprises a control part 5 for controlling operation mechanisms provided in the indexer cell ID and the cleaning cell SP to perform a cleaning process on the substrates W.

The indexer cell ID is a cell for passing an unprocessed substrate received from the outside of the apparatus to the cleaning cell SP and unloading a processed substrate received from the cleaning cell SP to the outside of the apparatus. The indexer cell ID comprises a plurality of (in this preferred embodiment, four) carrier stages 11 on each of which a carrier C is rested and a transfer robot IR for taking an unprocessed substrate W out from each carrier C and storing a processed substrate W into each carrier C.

The carrier C storing the unprocessed substrate W therein is loaded onto each of the carrier stages 11 from the outside of the apparatus by an AGV (Automated Guided Vehicle) or the like and rested thereon. Further, the substrate W on which the scrub cleaning process is finished in this apparatus is stored again into the carrier C rested on the carrier stage 11. The carrier C storing the processed substrate W therein is unloaded to the outside of the apparatus also by the AGV or the like. In other words, the carrier stage 11 serves as a substrate accumulation part for accumulating the unprocessed substrates W and the processed substrates W. As the form of the carrier C, a FOUP (Front Opening Unified Pod) storing substrates W in an enclosed space, an SMIF (Standard Mechanical Inter Face) pod or an OC (Open Cassette) exposing stored substrates W to air may be used.

The transfer robot IR comprises a transfer arm 12, an arm stage 13 on which the transfer arm 12 is rested and a movable base 14. The movable base 14 is in threaded engagement with a ball screw 15 extending in parallel to the alignment of the carrier stages 11 (along the Y-axis direction), being provided slidably on two guide rails 16 and 16. Therefore, when the ball screw 15 is rotated by a not-shown rotation motor, the whole transfer robot IR including the movable base 14 is moved horizontally along the Y-axis direction.

The arm stage 13 is rested on the movable base 14. In the movable base 14, a motor for driving the arm stage 13 to rotate about an axis center along the vertical direction (Z-axis direction) and a motor for driving the arm stage 13 to move up and down along the vertical direction, both of which are not shown, are integrated. Further, the transfer arm 12 is mounted on this arm stage 13. As shown in FIG. 1, the transfer arm 12 is shaped like a fork in a plan view. The transfer arm 12 supports a lower surface of the substrate W with its fork-shaped portion. Further, the transfer arm 12 can be moved to and fro along the horizontal direction (the direction of the radius of gyration of the arm stage 13) with its articulated mechanism bent and stretched by a drive mechanism (not shown) integrated in the arm stage 13.

With such a structure, the transfer arm 12 can move horizontally along the Y-axis direction, move up and down, rotate in the horizontal plane and move to and fro along the direction of the radius of gyration. Then, the transfer robot IR causes the transfer arm 12 which supports the substrate W with its fork-shaped portion to access the carrier C rested on the carrier stage 11 and a substrate passing part 50 described later, to thereby transfer the substrate W between the carrier stage 11 and the substrate passing part 50.

The cleaning cell SP is provided adjacently to the indexer cell ID. Between the indexer cell ID and the cleaning cell SP provided is a partition 19 for blocking the atmosphere, and the substrate passing part 50 is so provided as to penetrate part of the partition 19. In other words, the substrate passing part 50 is provided at a connecting portion between the indexer cell ID and the cleaning cell SP, being interposed therebetween to pass the substrate W from/to these cells.

The substrate passing part 50 of this preferred embodiment has a construction in which a reverse passing part RVPASS1, two stages of return rest parts RPASS1 and RPASS2, two stages of sending rest parts SPASS1 and SPASS2 and a reverse passing part RVPASS2 are layered in the vertical direction in this order from the upper side. The upper reverse passing part RVPASS1 and two stages of the return rest parts RPASS1 and RPASS2 are interposed to pass the processed substrate W from the cleaning cell SP to the indexer cell ID. On the other hand, the lower reverse passing part RVPASS2 and two stages of the sending rest parts SPASS1 and SPASS2 are interposed to pass the unprocessed substrate W from the indexer cell ID to the cleaning cell SP. More detailed discussion on the substrate passing part 50 will be made later.

The cleaning cell SP is a cell for performing the scrub cleaning process on the substrate W and comprises a front surface cleaning part SS1 for performing the scrub cleaning process on a front surface of the substrate W, a back surface cleaning part SS2 for performing the scrub cleaning process on a back surface of the substrate W, reversing parts FR and RF for reversing the front and back sides of the substrate W and a transport robot TR for passing the substrate W from/to the front surface cleaning part SS1, the back surface cleaning part SS2 and the reversing parts FR and RF. In the cleaning cell SP, the front surface cleaning part SS1 and the back surface cleaning part SS2 are arranged oppositely to each other with the transport robot TR interposed therebetween. Specifically, the front surface cleaning part SS1 is disposed on the back side of the apparatus and the back surface cleaning part SS2 is disposed on the front side of the apparatus. A "front surface" of a substrate W refers to one of main surfaces of the substrate W, on which a pattern is formed, and a "back surface" refers to the opposite side of the front surface. An "upper surface" of the substrate W is one of the main surfaces of the substrate W, which faces upward, and a "lower surface" is the other surface which faces downward (regardless of whether it is the front surface or the back surface).

As shown in FIG. 2, the front surface cleaning part SS1 has a construction in which four front surface cleaning units SS which have the same construction are layered. The front surface cleaning unit SS comprises a spin chuck 21 for holding the substrate W with its front surface facing upward and rotating it about an axis center along the vertical direction, a cleaning brush 22 coming into contact with or coming close to the front surface of the substrate W held on the spin chuck 21 to perform scrub cleaning, a nozzle 23 for discharging a cleaning solution (e.g., de-ionized water) onto the front surface of the substrate W, a spin motor 24 for driving the spin chuck 21 to rotate, a cup (not shown) surrounding the substrate W held on the spin chuck 21, and the like.

On the other hand, the back surface cleaning part SS2 has a construction in which four back surface cleaning units SS which have the same construction are layered. The back surface cleaning unit SS comprises a spin chuck 31 for holding the substrate W with its back surface facing upward and rotating it about an axis center along the vertical direction, a cleaning brush 32 coming into contact with or coming close to the back surface of the substrate W held on the spin chuck 31 to perform scrub cleaning, a nozzle 33 for discharging a cleaning solution (e.g., de-ionized water) onto the back surface of the substrate W, a spin motor 34 for driving the spin chuck 31 to rotate, a cup (not shown) surrounding the substrate W held on the spin chuck 31, and the like. Though the spin chuck 21 of the front surface cleaning unit SS for performing front surface cleaning may be a vacuum adsorptive one since the substrate W is held from the back side, the spin chuck 31 of the back surface cleaning unit SSR for performing back surface cleaning has to be one which mechanically holds an edge portion of the substrate W since the substrate W is held from the front side.

The two reversing parts FR and RF are provided at an end portion ((+X) side end portion) of a transport path in which the transport robot TR is provided on the side opposite to the indexer cell ID. The reversing part FR reverses the substrate W with its front surface facing upward 180 degrees upside down to cause its back surface to face upward. Conversely, the reversing part RF reverses the substrate W with its back surface facing upward 180 degrees upside down to cause its front surface to face upward.

The transport robot TR comprises two transfer arms 42a and 42b, an arm stage 43 on which these transfer arms are rested and a base 44. The base 44 is fixed to a frame of the cleaning cell SP. Therefore, the whole transport robot TR does not move in the horizontal direction.

On the base 44, the arm stage 43 is rested. In the base 44, a motor for driving the arm stage 43 to rotate about an axis center along the vertical direction (Z-axis direction) and a motor for driving the arm stage 43 to move up and down along the vertical direction, both of which are not shown, are integrated. Further, the two transfer arms 42a and 42b are mounted on the arm stage 43, being arranged vertically with a space of predetermined pitch. As shown in FIG. 1, the transfer arms 42a and 42b are each shaped like a fork in a plan view. Each of the transfer arms 42a and 42b supports a lower surface of the substrate W with its fork-shaped portion. Further, the transfer arms 42a and 42b can be moved to and fro independently of each other along the horizontal direction (the direction of the radius of gyration of the arm stage 43) with their articulated mechanisms bent and stretched by a drive mechanism (not shown) integrated in the arm stage 43.

With such a structure, the transport robot TR causes the two transfer arms 42a and 42b to individually access the front surface cleaning part SS1, the back surface cleaning part SS2, the reversing parts FR and RF and the substrate passing part 50, to thereby pass and receive the substrate W to/from these parts. Further, as an elevation driving mechanism of the transport robot TR, other mechanisms such as a belt feeder mechanism using a pulley and a timing belt may be used.

The control part 5 controls various operation mechanisms provided in the substrate processing apparatus 1. The control part 5 has a constitution of general computer system as hardware. Specifically, the control part 5 comprises a CPU for performing various computations, a ROM for storing a basic program, a RAM which is a readable and writable memory for storing various information, and a magnetic disk for storing control software or data.

Subsequently, detailed discussion will be made on the substrate passing part 50. As discussed above, the substrate passing part 50 comprises two stages of the return rest parts RPASS1 and RPASS2, two stages of the sending rest parts SPASS1 and SPASS2 and two stages of reverse passing parts RVPASS1 and RVPASS2. Among these parts, the reverse passing parts RVPASS1 and RVPASS2 reverse the front and back sides of the substrate W 180 degrees and pass it, and so also have the function as the reversing part as well as the function of passing substrates.

Figure 5:
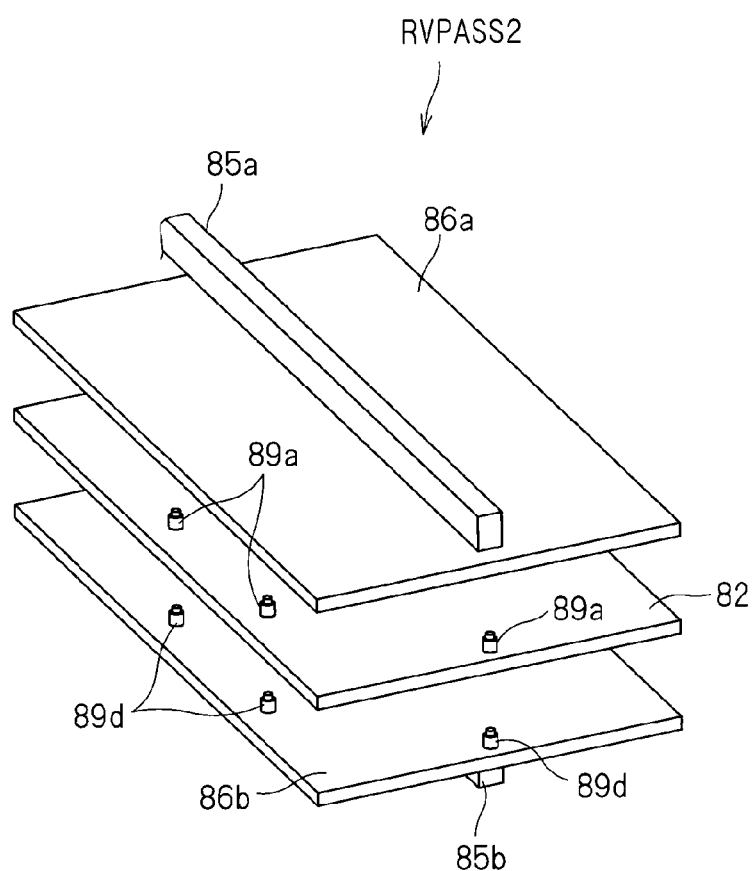
FIG. 5 is a perspective view showing the reverse passing part.

FIG. 4 is a side elevation showing the reverse passing part RVPASS2. FIG. 5 is a perspective view showing the reverse passing part RVPASS2. Though discussion will be made below on the reverse passing part RVPASS2, the reverse passing part RVPASS1 has altogether the same construction as that of the reverse passing part RVPASS2. The reverse passing part RVPASS2 comprises a support plate 81, a fixed plate 82, a pair of linear guides 83a and 83b, a pair of supporting members 85a and 85b, a pair of cylinders 87a and 87b, a first movable plate 86a, a second movable plate 86b and a rotary actuator 88.

The support plate 81 is provided, extending along the vertical direction. At a center portion of one side of the support plate 81, the fixed plate 82 is provided perpendicularly thereto, extending along the horizontal direction. Further, at the above one side of the support plate 81, the pair of linear guides 83a and 83b are provided extending therealong, with the fixed plate 82 interposed therebetween. Both the linear guides 83a and 83b are provided extending along the vertical direction, in symmetry with respect to the fixed plate 82.

To the linear guide 83a, the supporting member 85a extending along the horizontal direction is attached slidably via a connecting member 84a. The cylinder 87a is connected to the supporting member 85a and with the cylinder 87a, the supporting member 85a is guided by the linear guide 83a to move up and down along the vertical direction. The supporting member 85a maintains its attitude extending along the horizontal direction always in up-and-down movement. Further, the first movable plate 86a is attached to the supporting member 85a, facing one side of the fixed plate 82.

Similarly, to the linear guide 83b, the supporting member 85b extending along the horizontal direction is attached slidably via a connecting member 84b. The cylinder 87b is connected to the supporting member 85b and with the cylinder 87b, the supporting member 85b is guided by the linear guide 83b to move up and down along the vertical direction. The supporting member 85b maintains its attitude extending along the horizontal direction always in up-and-down movement. Further, the second movable plate 86b is attached to the supporting member 85b, facing the other side (opposite to the above one side) of the fixed plate 82.

The rotary actuator 88 rotates the support plate 81 about a rotary central axis RX along the horizontal direction (Y-axis direction). When the support plate 81 is rotated, all of the first movable plate 86a, the second movable plate 86b and the fixed plate 82 which are connected thereto rotate about the rotary central axis RX while maintaining their mutual positional relation.

As shown in FIG. 5, the first movable plate 86a, the second movable plate 86b and the fixed plate 82 each have a plate-like shape. As shown in FIG. 4, a plurality of support pins 89a stand on one side of the fixed plate 82 facing the first movable plate 86a, and a plurality of support pins 89b stand on the other side of the fixed plate 82 facing the second movable plate 86b. Further, a plurality of support pins 89c stand on one surface of the first movable plate 86a facing the fixed plate 82, and a plurality of support pins 89d stand on one surface of the second movable plate 86b facing the fixed plate 82.

Figure 6:
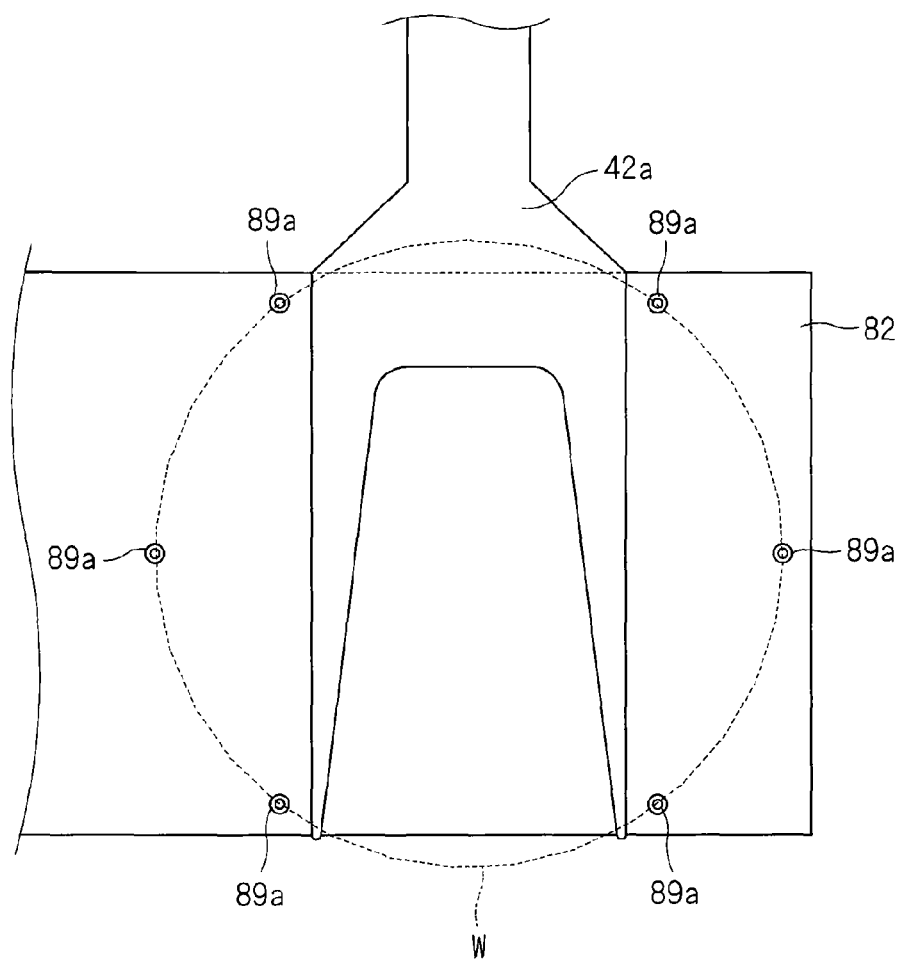
FIG. 6 is a view showing a state where a transfer arm of a transport robot accesses the reverse passing part.

FIG. 6 is a view showing a state where the transfer arm 42a of the transport robot TR accesses the reverse passing part RVPASS1 or RVPASS2. In this preferred embodiment, six support pins 89a, six support pins 89b, six support pins 89c and six support pins 89d are so arranged as to be along the outer peripheral portion of the substrate W. Herein, the reverse passing parts RVPASS1 and RVPASS2 are provided so that the rotary central axis RX may extend along the Y-axis direction. On the other hand, as shown in FIG. 1, the transfer robot IR and the transport robot TR cause the transfer arm 12 and the transfer arms 42a and 42b, respectively, to access the substrate passing part 50 along the X-axis direction. Specifically, the transfer arm 12 and the transfer arms 42a and 42b move toward/from the reverse passing part RVPASS1 or RVPASS2 from the horizontal direction perpendicular to the rotary central axis RX (the direction perpendicular to the paper of FIG. 4).

Further, as shown in FIG. 6, the six support pins 89a stand at such positions as not to interfere with the transfer arm 42a which moves from the horizontal direction perpendicular to the rotary central axis RX. Though the arrangement of the support pins 89a is shown in FIG. 6, other support pins 89b, 89c and 89d are arranged like the support pins 89a. The transfer arm 42b of the transport robot TR moves toward/from the reverse passing part RVPASS1 or RVPASS2 from the same direction as the transfer arm 42a does and is prevented from interfering with the support pins 89a, 89b, 89c or 89d. The transfer arm 12 of the transfer robot IR has a shape which is slightly different from that of the transfer arm 42a and 42b but moves toward/from the reverse passing part RVPASS1 or RVPASS2 from the X-axis direction without interfering with the support pins 89a, 89b, 89c or 89d.

The fixed plate 82 is provided with optical detection sensors 80a and 80b on the above one side and the other side, respectively. Further, a detection sensor 80c is provided on one surface of the first movable plate 86a facing the fixed plate 82 and a detection sensor 80d is provided on one surface of the second movable plate 86b facing the fixed plate 82. The detection sensors 80a, 80b, 80c and 80d optically detect whether or not the substrate W is supported by a plurality of support pins 89a, 89b, 89c and 89d, respectively.

Other constituent elements, i.e., two stages of the return rest parts RPASS1 and RPASS2 and two stages of the sending rest parts SPASS1 and SPASS2, each have a constitution in which a plurality of (e.g., three) fixed support pins stand on a flat plate. These fixed support pins are arranged at such positions as not to interfere with the transfer arm 12 and the transfer arms 42a and 42b which access the substrate passing part 50. Therefore, the transfer robot IR of the indexer cell ID and the transport robot TR of the cleaning cell SP can access the return rest parts RPASS1 and RPASS2 and the sending rest parts SPASS1 and SPASS2 to pass and receive the substrate W. Further, the return rest parts RPASS1 and RPASS2 and the sending rest parts SPASS1 and SPASS2 are each provided with an optical detection sensor for detecting whether or not the substrate W is rested thereon.

Next, discussion will be made on an operation of the substrate processing apparatus 1. Since the substrate processing apparatus 1 comprises the front surface cleaning part SS1 for performing front surface cleaning of the substrate W and the back surface cleaning part SS2 for performing back surface cleaning, the substrate processing apparatus 1 can perform various patterns of cleaning processes in accordance with purposes. For example, only the front surface of the substrate W may be cleaned, only the back surface may be cleaned conversely, and both of the surfaces may be cleaned. Which type of cleaning is performed can be set by a recipe describing the procedure of transferring the substrates W (a procedure of transferring substrates is referred to as a "flow") and the processing condition. In this preferred embodiment, the operation of the substrate processing apparatus 1 will be discussed, taking an exemplary case where only the back surface of the substrate W is cleaned.

In the case where only the back surface of the substrate W is cleaned, the flow shown in Table 1 below is set as a recipe and the substrates W are transferred in accordance with this flow.

TABLE 1

| Step | Transfer Target |
|---|---|
| 1 | Indexer Cell ID |
| 2 | Reverse Passing Part RVPASS2 |
| 3 | Back Surface Cleaning Part SS2 |
| 4 | Reverse Passing Part RVPASS1 |
| 5 | Indexer Cell ID |

Specifically, first, the unprocessed substrate W which is stored in the carrier C is loaded onto the carrier stage 11 of the indexer cell ID by the AGV or the like from the outside of the apparatus. Next, the transfer robot IR of the indexer cell ID takes the unprocessed substrate W from the carrier C and transfers it to the reverse passing part RVPASS2 of the substrate passing part 50. The reverse passing part RVPASS2 which receives the unprocessed substrate W reverses the front and back sides of the substrate W. Subsequently, the reversed substrate W is passed to the transport robot TR of the cleaning cell SP. The operation of passing the substrate W via the reverse passing part RVPASS2 will be discussed later.

Next, the transport robot TR transports the unprocessed substrate W which is thereby received to any one of the back surface cleaning units SSR in the back surface cleaning part SS2. In the back surface cleaning unit SSR, the spin chuck 31 rotates the substrate W with its back surface facing upward while holding it and the nozzle 33 supplies the cleaning solution to the back surface of the substrate W. In this state, the cleaning brush 32 comes into contact with or comes close to the back surface of the substrate W and scans it in the horizontal direction, to perform the scrub cleaning process on the back surface of the substrate W. Since the four back surface cleaning units SSR in the back surface cleaning part SS2 are concurrent processing units having the same construction, the transport robot TR may transport the substrate W to any one of the back surface cleaning units SSR.

After the back surface cleaning is finished, the transport robot TR takes the substrate W from the back surface cleaning unit SSR and transports it to the reverse passing part RVPASS1 of the substrate passing part 50. The reverse passing part RVPASS1 which receives the processed substrate W reverses the front and back sides of the substrate W. Subsequently, the transfer robot IR stores the processed substrate W after being reversed into the carrier C.

In the above exemplary case, supposing that the substrate W is transferred via the sending rest parts SPASS1 and SPASS2 and the return rest parts RPASS1 and RPASS2, the substrate W needs to be reversed by the reversing parts FR and RF in the cleaning cell SP. In this case, the number of transporting steps performed by the transport robot TR increases and the transport robot TR determines the processing speed of the whole substrate processing apparatus 1.

Then, in this preferred embodiment, the substrates W are transferred between the transfer robot IR of the indexer cell ID and the transport robot TR of the cleaning cell SP via the reverse passing part RVPASS1 or RVPASS2. The reverse passing parts RVPASS1 and RVPASS2 not only transfer the substrates W between these robots but also reverse them. Therefore, the number of transporting steps to be performed by the transport robot TR decreases. While the reverse passing part RVPASS1 or RVPASS2 reverses the substrate W, however, if the transfer robot IR and the transport robot TR can not transfer the next substrate W, there arises some standby time in the operations of the transfer robot IR and the transport robot TR and this disadvantageously reduces the throughput of the substrate processing apparatus 1.

For this reason, the transfer of the substrates W via the reverse passing part RVPASS1 or RVPASS2 is performed in the following manner. Herein, discussion will be made on an exemplary case where the substrates W are transferred from the transfer robot IR to the transport robot TR via the reverse passing part RVPASS2. FIGS. 7 to 12 are illustrations of an operation for transferring the substrate W via the reverse passing part RVPASS2.

First, as shown in FIG. 7, the transfer arm 12 of the transfer robot IR which holds the unprocessed substrate W with its front surface facing upward moves to between the fixed plate 82 and the second movable plate 86b and stops at a position where the substrate W is present immediately above a plurality of support pins 89d. Subsequently, the transfer arm 12 moves down until the substrate W is supported by the support pins 89d. The transfer arm 12 which has passed the unprocessed substrate W moves back out of the reverse passing part RVPASS2.

Next, as shown in FIG. 8, the cylinder 87a moves the first movable plate 86a down while the cylinder 87b moves the second movable plate 86b up. The substrate W with its front surface facing upward is thereby held by the support pins 89b of the fixed plate 82 and the support pins 89d of the second movable plate 86b.

In this state, as shown in FIG. 9, the rotary actuator 88 rotates the whole of the first movable plate 86a, the second movable plate 86b and the fixed plate 82 180 degrees about the rotary central axis RX. Consequently, the front surface and the back surface of the substrate W held by the support pins 89b and the support pins 89d are reversed and the back surface of the substrate W thereby faces upward.

Next, as shown in FIG. 10, the cylinder 87a moves the first movable plate 86a down while the cylinder 87b moves the second movable plate 86b up. As shown in FIG. 11, this causes the first movable plate 86a and the second movable plate 86b to separate from the fixed plate 82 and the substrate W with its back surface facing upward is held by a plurality of support pins 89b of the fixed plate 82.

After that, the transfer arm 42b (or the transfer arm 42a) of the transport robot TR moves to below the substrate W and moves up, to thereby receive the substrate W. Subsequently, as shown in FIG. 12, the transfer arm 42b which receives the unprocessed substrate W moves back out of the reverse passing part RVPASS2. Further, the transfer arm 12 of the transfer robot IR which holds the following unprocessed substrate W moves to between the fixed plate 82 and the first movable plate 86a, and after that, the same procedure is repeated. Thus, the transfer of the substrate W from the transfer robot IR to the transport robot TR via the reverse passing part RVPASS2 is sequentially performed.

Though the transfer of the unprocessed substrate W via the reverse passing part RVPASS2 has been discussed above, the transfer of the processed substrate W from the transport robot TR to the transfer robot IR via reverse passing part RVPASS1 is performed in the same manner.

FIG. 13 is an illustration of a concept of transferring the substrate W via the reverse passing part RVPASS1 or RVPASS2. The reverse passing part RVPASS1 comprises a first holding mechanism 91 consisting of the fixed plate 82 and the first movable plate 86a and a second holding mechanism 92 consisting of the fixed plate 82 and the second movable plate 86b. The first holding mechanism 91 and the second holding mechanism 92 are rotated by the rotary actuator 88 about the rotary central axis RX along the horizontal direction. The first holding mechanism 91 and the second holding mechanism 92 are arranged in vertically symmetry with respect to the rotary central axis RX. Then, the first holding mechanism 91 and the second holding mechanism 92 are rotated as one unit by the rotary actuator 88 while holding the symmetrical positional relation with respect to the rotary central axis RX. Therefore, when the rotary actuator 88 rotates the first holding mechanism 91 and the second holding mechanism 92 180 degrees about the rotary central axis RX, the first holding mechanism 91 and the second holding mechanism 92 replace each other in position.

If the first holding mechanism 91 and the second holding mechanism 92 of the reverse passing part RVPASS1 are present at the vertical positions H1 and H2, respectively, as shown in FIG. 13, for example, when the rotary actuator 88 rotates the first holding mechanism 91 and the second holding mechanism 92 180 degrees, the first holding mechanism 91 comes to the vertical position H2 and the second holding mechanism 92 comes to the vertical position H1. When the rotary actuator 88 further rotates the first holding mechanism 91 and the second holding mechanism 92 180 degrees, the first holding mechanism 91 comes to the vertical position H1 and the second holding mechanism 92 comes to the vertical position H2 again. In other words, in the reverse passing part RVPASS1, every time when the rotary actuator 88 rotates the first holding mechanism 91 and the second holding mechanism 92 180 degrees, the first holding mechanism 91 and the second holding mechanism 92 alternately replace each other in position between the vertical positions H1 and H2.

Similarly, the reverse passing part RVPASS2 comprises a third holding mechanism 93 consisting of the fixed plate 82 and the first movable plate 86a and a fourth holding mechanism 94 consisting of the fixed plate 82 and the second movable plate 86b. The third holding mechanism 93 and the fourth holding mechanism 94 are rotated by the rotary actuator 88 about the rotary central axis RX along the horizontal direction. The third holding mechanism 93 and the fourth holding mechanism 94 are arranged in vertically symmetry with respect to the rotary central axis RX. Then, the third holding mechanism 93 and the fourth holding mechanism 94 are rotated as one unit by the rotary actuator 88 while holding the symmetrical positional relation with respect to the rotary central axis RX. Therefore, when the rotary actuator 88 rotates the third holding mechanism 93 and the fourth holding mechanism 94 180 degrees about the rotary central axis RX, the third holding mechanism 93 and the fourth holding mechanism 94 replace each other in position.

If the third holding mechanism 93 and the fourth holding mechanism 94 of the reverse passing part RVPASS2 are present at the vertical positions H3 and H4, respectively, for example, when the rotary actuator 88 rotates the third holding mechanism 93 and the fourth holding mechanism 94 180 degrees, the third holding mechanism 93 comes to the vertical position H4 and the fourth holding mechanism 94 comes to the vertical position H3. When the rotary actuator 88 further rotates the third holding mechanism 93 and the fourth holding mechanism 94 180 degrees, the third holding mechanism 93 comes to the vertical position H3 and the fourth holding mechanism 94 comes to the vertical position H4 again. In other words, in the reverse passing part RVPASS2, every time when the rotary actuator 88 rotates the third holding mechanism 93 and the fourth holding mechanism 94 180 degrees, the third holding mechanism 93 and the fourth holding mechanism 94 alternately replace each other in position between the vertical positions H3 and H4.

For the reverse passing part RVPASS2 which performs such an operation as above, the transfer robot IR of the indexer cell ID passes the unprocessed substrate W to the third holding mechanism 93 or the fourth holding mechanism 94 always at the vertical position H4. The unprocessed substrate W reversed by the reverse passing part RVPASS2 is passed to the transport robot TR of the cleaning cell SP from the third holding mechanism 93 or the fourth holding mechanism 94 always at the vertical position H3. In other words, the third holding mechanism 93 and the fourth holding mechanism 94 are dedicated to the loading of the unprocessed substrate W at the vertical position H4 and dedicated to the unloading of the unprocessed substrate W at the vertical position H3.

On the other hand, for the reverse passing part RVPASS1, the transport robot TR of the cleaning cell SP passes the processed substrate W to the first holding mechanism 91 or the second holding mechanism 92 always at the vertical position H1. The processed substrate W reversed by the reverse passing part RVPASS1 is passed to the transfer robot IR of the indexer cell ID from the first holding mechanism 91 or the second holding mechanism 92 always at the vertical position H2. In other words, the first holding mechanism 91 and the second holding mechanism 92 are dedicated to the loading of the processed substrate W at the vertical position H1 and dedicated to the unloading of the processed substrate W at the vertical position H2.

Thus, the reverse passing part RVPASS2 provided between the indexer cell ID and the cleaning cell SP reverses the unprocessed substrate W received from the transfer robot IR and passes it to the transport robot TR. Similarly, the reverse passing part RVPASS1 provided between the indexer cell ID and the cleaning cell SP reverses the processed substrate W received from the transport robot TR and passes it to the transfer robot IR.

Herein, attention is paid to the control of transfer in order for the transfer robot IR to load the unprocessed substrate W into the reverse passing part RVPASS2. The transfer robot IR takes the first unprocessed substrate W from the carrier C and loads it into the fourth holding mechanism 94 of the reverse passing part RVPASS2 at the vertical position H4. Then, after the third holding mechanism 93 and the fourth holding mechanism 94 rotate 180 degrees, the transfer robot IR loads the second unprocessed substrate W into the third holding mechanism 93 at the vertical position H4. At the point of time when the fourth holding mechanism 94 comes to the vertical position H3, the transport robot TR can unload the first unprocessed substrate W therefrom. Whether the substrate W is unloaded from the fourth holding mechanism 94 or not can be detected by the detection sensor 80b. When the second substrate W is loaded into the third holding mechanism 93 and the first substrate W is unloaded from the fourth holding mechanism 94, the third holding mechanism 93 and the fourth holding mechanism 94 immediately rotate 180 degrees.

Then, when it is detected that the first unprocessed substrate W is unloaded from the fourth holding mechanism 94, the control part 5 controls the transfer robot IR to transfer the third unprocessed substrate W from the carrier C to the reverse passing part RVPASS2. In other words, before the process of reversing the preceding substrate W (herein, the second unprocessed substrate W) is finished, the transfer of the following substrate W (herein, the third unprocessed substrate W) starts. This reduces the standby time of the transfer robot IR to a minimum.

In the case where the transport robot TR loads the processed substrate W into the reverse passing part RVPASS1, the same control of transfer is performed, to thereby reduce the standby time of the transport robot TR to a minimum. This increases the throughput of the whole substrate processing apparatus 1.

Providing two reverse passing parts (four reverse passing parts in the whole substrate passing part 50) each of which is the same as the reversing part FR or RF having only one stage of the holding mechanism for the substrate W, instead of the reverse passing part RVPASS1 (or the reverse passing part RVPASS2), also makes it possible to start the transfer of the following substrate W before the process of reversing the preceding substrate W is finished. The height of the two layered reverse passing parts, however, disadvantageously becomes higher than the reverse passing part RVPASS1 (or the reverse passing part RVPASS2) of this preferred embodiment. For example, the height of the reverse passing part for reversing the substrate W of φ300 mm is at least 300 mm or more and the height of two layered reverse passing parts is 600 mm or more. On the other hand, the height of the reverse passing part RVPASS1 (or the reverse passing part RVPASS2) having two stages of holding mechanisms with the rotary central axis RX interposed therebetween can be lower than 600 mm. Therefore, it is possible to reduce the height of the whole substrate passing part 50 to a minimum.

Since the transport robot TR of the cleaning cell SP do not move in the horizontal direction, it is relatively easy to increase the range of movement in the vertical direction. On the other hand, since the transfer robot IR of the indexer cell ID also moves along the horizontal direction, it is hard to increase the range of movement in the vertical direction up to the level of the transport robot TR. In this preferred embodiment, since one reverse passing part RVPASS1 (or the reverse passing part RVPASS2) can perform the control of transfer like the case where two reverse passing parts each having only one stage of the holding mechanism are provided, it is possible to reduce the respective standby times of the transfer robot IR and the transport robot TR to a minimum while minimizing the number of reverse passing parts. As a result, the substrate passing part 50 can be contained within the range of height where the transfer robot IR having a limiting range of movement in the vertical direction can access, and it is possible to reduce the respective standby times of the transfer robot IR and the transport robot TR to a minimum and to thereby increase the throughput of the substrate processing apparatus 1.

While the preferred embodiment of the present invention has been discussed, numerous modifications and variations can be devised without departing from the scope of the invention. For example, though discussion of the above preferred embodiment has been made taking the reverse passing parts RVPASS1 and RVPASS2 for reversing and transferring the substrate W between the indexer cell ID and the cleaning cell SP as an example, the same reverse passing parts as those in the above-discussed preferred embodiment may be provided between a sending side cell having a transport robot to send the substrate W and a receiving side cell having a transport robot to receive the substrate W sent from the sending side cell. The transport robot of the sending side cell can start the transfer of the following substrate W before the process of reversing the preceding substrate W is finished, and the standby time of the transport robot can be thereby reduced to a minimum. Further, the number of reverse passing parts included in the substrate passing part is minimized and the range of up-and-down movement of the transport robot can be thereby reduced.

One exemplary construction having the sending side cell and the receiving side cell like above is a coater & developer in which a cell for performing a resist coating process and a cell for performing a development process are arranged in parallel with the substrate passing part interposed therebetween. In the coater & developer for an immersion exposure apparatus, especially, since a reverse process is sometimes performed to clean the back surface of a substrate, if the same reverse passing parts as those in the above-discussed preferred embodiment are provided in the substrate passing part between the cells, it is possible to reduce the standby time of the transport robot to a minimum.

Figure 14:
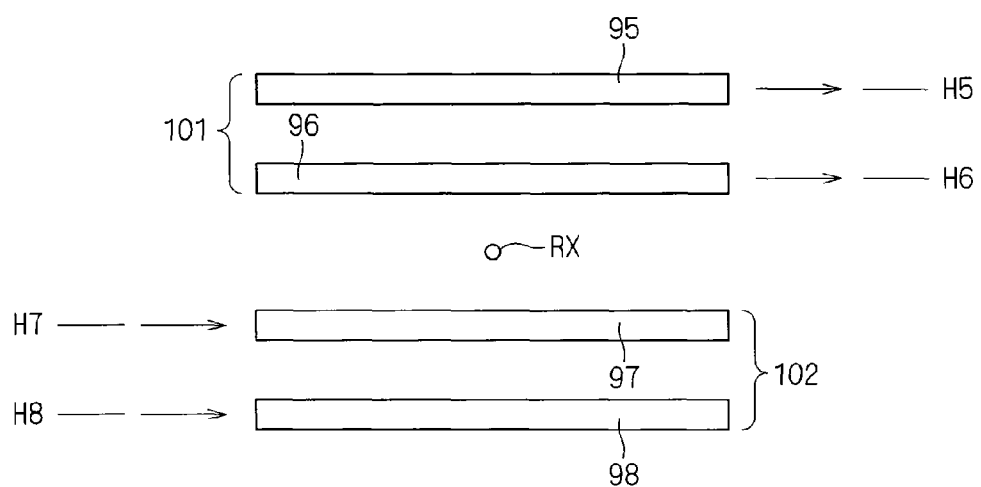

Further, though one reverse passing part has two holding mechanisms in the above preferred embodiment, the number of holding mechanisms is not limited to two. For example, if at least one of the transport robots which transfer the substrates via the reverse passing part has two transfer arms to concurrently transport two substrates W, the reverse passing part comprises four holding mechanisms. In this case, as shown in FIG. 14, the four holding mechanisms are divided by two and arranged in symmetry with respect to the rotary central axis RX. Specifically, a first holding part 101 consisting of the holding mechanisms 95 and 96 and a second holding part 102 consisting of the holding mechanisms 97 and 98 are arranged in vertically symmetry with respect to the rotary central axis RX. Then, the first holding part 101 and the second holding part 102 are rotated as one unit while holding the symmetrical positional relation with respect to the rotary central axis RX. Therefore, when first holding part 101 and the second holding part 102 rotate 180 degrees about the rotary central axis RX, the holding mechanisms 95 and 96 and the holding mechanisms 97 and 98 replace each other in position.

In the case of FIG. 14, if the holding mechanisms 95 and 96 are present at the vertical positions H5 and H6, respectively, and the holding mechanisms 97 and 98 are present at the vertical positions H7 and H8, respectively, when the first holding part 101 and the second holding part 102 rotate 180 degrees about the rotary central axis RX, the holding mechanisms 95 and 96 come to the vertical positions H8 and H7, respectively, and the holding mechanisms 97 and 98 come to the vertical positions H6 and H5, respectively. When the first holding part 101 and the second holding part 102 further rotate 180 degrees, the holding mechanisms 95 to 98 return to their respective original positions.

When the transport robot concurrently loads two substrates W into the reverse passing part comprising such four holding mechanisms, the substrates W are concurrently passed to the holding mechanisms 95 and 96 or the holding mechanisms 97 and 98 at the vertical positions H7 and H8. Then, when the reversed two substrates W are concurrently unloaded, the substrates W are concurrently passed from the holding mechanisms 95 and 96 or the holding mechanisms 97 and 98 at the vertical positions H5 and H6. This can also minimize the number of reverse passing parts and reduce the standby time of the transport robot to a minimum.

The reverse passing part may comprise more stages of holding mechanisms. Specifically, if one of the transport robots which transfer the substrates via the reverse passing part (e.g., the transfer robot IR) comprises m transfer arms (m is an integer not less than 1) to concurrently transfer m substrates, and the other transport robot (e.g., the transport robot TR) comprises n transfer arms (n is an integer not less than 1) to concurrently transfer n substrates, each of the first holding part 101 and the second holding part 102 which are arranged in symmetry with respect to the rotary central axis RX has only to be provided with holding mechanisms as many as m or n which is larger one. The exemplary case discussed in the above preferred embodiment is a case where the first holding part 101 and the second holding part 102 each have one holding mechanism, in other words, m=n=1. It thereby becomes possible to reduce the standby time of the transport robot while allowing the concurrent transfer of m or n substrates. Further, it is possible to minimize the number of reverse passing parts and reduce the range of up-and-down movement of the transport robot. As a specific construction to increase the number of stages of the holding mechanisms in the reverse passing part, a plurality of multistage structures, one of which is shown in FIG. 4, have only to be further provided.

Further, a flow of performing front surface cleaning of substrates W in the substrate processing apparatus 1 of the above-discussed preferred embodiment can be also set. In this case, depending on which process step the front surface cleaning is performed in, there is also a case where no process of reversing the substrate W is performed in the substrate passing part 50. In the case where no process of reversing the substrate W is performed in the substrate passing part 50, the substrate W has only to be passed between the transfer robot IR and the transport robot TR via two stages of return rest parts RPASS1 and RPASS2 and/or two stages of sending rest parts SPASS1 and SPASS2. Further, there may be a case where no reverse process is performed in the reverse passing part RVPASS1 or RVPASS2 and only the transfer of the substrate W is performed. In this case, the substrate W is loaded and unloaded into/from the reverse passing part RVPASS1 or RVPASS2 at the same vertical position. If the case where the reverse process is performed and the case where no reverse process is performed are mixed, however, the control therefor becomes very hard. Therefore, if no reverse process is performed in the substrate passing part 50, it is preferable that the return rest parts RPASS1 and RPASS2 and the sending rest parts SPASS1 and SPASS2 should be provided.

Further, in the substrate processing apparatus 1 of the above-discussed preferred embodiment, the two reversing parts FR and RF may have the same structure as that of the reverse passing parts RVPASS1 and RVPASS2. There is a case where the transfer arms 42*a* and 42*b* of the transport robot TR in the cleaning cell SP are used for strictly different purposes. For example, the upper transfer arm 42*a* is dedicated to the transport of the processed substrates W and the lower transfer arm 42*b* is dedicated to the transport of the unprocessed substrates W, to thereby prevent particles and the like on the unprocessed substrates W from being transferred to the cleaned substrates W. On the other hand, the transport robot TR usually uses the two transfer arms 42*a* and 42*b* to perform such a transport as to replace the unprocessed substrate W and the processed substrate W (so-called simultaneous replacement).

In such a case, if a flow that the reverse process is performed after the final cleaning process is set, there arises a situation where the lower transfer arm 42*b* which is originally dedicated to the transport of the unprocessed substrates W must hold the substrate W on which the final cleaning process is finished. In other words, in order for the reversing part to perform simultaneous replacement, the lower transfer arm 42*b* first receives the reversed substrate W and then the upper transfer arm 42*a* loads the substrate W after being subjected to the final cleaning process. Then, in the substrate processing apparatus 1, if the two reversing parts FR and RF have the same structure as that of the reverse passing parts RVPASS1 and the RVPASS2, since the upper transfer arm 42*a* passes the substrate W after being subjected to the final cleaning process to the reversing part and then this upper transfer arm 42*a* receives the reversed substrate W, it is possible to use the transfer arms 42*a* and 42*b* for strictly different purposes.

Further, though the indexer cell ID and the cleaning cell SP are connected to each other in the above-discussed preferred embodiment, there may be a construction in which a cell dedicated to front surface cleaning is connected to the indexer cell ID and a cell dedicated to back surface cleaning is further connected to the cell for front surface cleaning. In this case, the reverse passing parts of this preferred embodiment may be provided between the indexer cell ID and the cell for front surface cleaning and between the cell for front surface cleaning and the cell for back surface cleaning.

Furthermore, in the substrate passing part 50 of the above-discussed preferred embodiment, the return rest parts RPASS1 and the RPASS2 and the sending rest parts SPASS1 and the SPASS2 do not always need to be provided, and in the case where only back surface cleaning is performed in the substrate processing apparatus 1, there may be a construction in which only the reverse passing parts RVPASS1 and the RVPASS2 are provided.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method for successively transferring a plurality of substrates available at a substrate carrier from a first transport robot of a sending side section which sends the substrates to a second transport robot of a receiving side section which receives the substrates via a reverse passing part for reversing a front surface and a back surface of a substrate, said reverse passing having a first vertical position and a second vertical position, comprising the steps of:
   a) passing a substrate to a first holding part of said reverse passing part always at said first vertical position by said first transport robot;
   b) receiving a substrate from a second holding part of said reverse passing part always at said second vertical position by said second transport robot;
   c) rotating said first holding part and said second holding part of said reverse passing part 180 degrees about a rotary central axis along a horizontal direction to move said first holding part to said second vertical position and move said second holding part to said first vertical position;
   d) passing a substrate to said second holding part always at said first vertical position by said first transport robot;
   e) receiving a substrate from said first holding part always at said second vertical position by said second transport robot;
   f) rotating said first holding part and said second holding part of said reverse passing part 180 degrees about said rotary central axis to move said first holding part to said first vertical position and move said second holding part to said second vertical position; and g) repeating said step a) to step f),
   wherein,
   said first transport robot starts transport of a substrate to be passed to said second holding part of said reverse passing part in said step d) to take the substrate from the substrate carrier and move the substrate toward said reverse passing part before the reverse process of a substrate passed to said first holding part of said reverse passing part in said step a) is completed in said step c).

2. The substrate processing method according to claim 1, wherein said first transport robot comprises m transfer arms (m: an integer not less than 1) and transfers m substrates at one time, said second transport robot comprises n transfer arms (n: an integer not less than 1) and transfers n substrates at one time, and said first holding part and said second holding part each have substrate holding mechanisms as many as m or n which is larger one.

3. A substrate processing method for successively transferring a plurality of substrates available at a substrate carrier between a transport robot of a processing section having a processing part and a transfer robot of an indexer section, comprising the steps of:
   a) passing an unprocessed substrate to a first holding part of a first reverse passing part having a first vertical position and a second vertical position, for reversing a front surface and a back surface of a substrate always at said first vertical position by said transfer robot;
   b) receiving an unprocessed substrate from a second holding part of said first reverse passing part always at said second vertical position by said transport robot;

c) rotating said first holding part and said second holding part of said first reverse passing part 180 degrees about a first rotary central axis along a horizontal direction to move said first holding part to said second vertical position and move said second holding part to said first vertical position;

d) passing an unprocessed substrate to said second holding part always at said first vertical position by said transfer robot;

e) receiving an unprocessed substrate from said first holding part always at said second vertical position by said transport robot;

f) rotating said first holding part and said second holding part of said first reverse passing part 180 degrees about said first rotary central axis to move said first holding part to said first vertical position and move said second holding part to said second vertical position; and g) repeating said step a) to step f), wherein, said transfer robot starts transport of a substrate to be passed to said second holding part of said first reverse passing part in said step d) to take the substrate from the substrate carrier and move the substrate toward said reverse passing part before the reverse process of a substrate passed to said first holding part of said first reverse passing part in said step a) is completed in said step c).

4. The substrate processing method according to claim 3, further comprising the steps of:

h) receiving a processed substrate from a third holding part of a second reverse passing part for reversing a front surface and a back surface of a substrate always at a third vertical position of said second reverse passing part by said transfer robot;

i) passing a processed substrate to a fourth holding part of said second reverse passing part always at a fourth vertical position of said second reverse passing part by said transport robot;

j) rotating said third holding part and said fourth holding part of said second reverse passing part 180 degrees about a second rotary central axis along a horizontal direction to move said third holding part to said fourth vertical position and move said fourth holding part to said third vertical position;

k) receiving a processed substrate from said fourth holding part at said third vertical position by said transfer robot;

l) passing a processed substrate to said third holding part at said fourth vertical position by said transport robot;

m) rotating said third holding part and said fourth holding part of said second reverse passing part 180 degrees about said second rotary central axis to move said third holding part to said third vertical position and move said fourth holding part to said fourth vertical position; and n) repeating said step h) to step m).

5. The substrate processing method according to claim 4, wherein said transfer robot comprises m transfer arms (m: an integer not less than 1) and transfers m substrates at one time, said transport robot comprises n transfer arms (n: an integer not less than 1) and transfers n substrates at one time, and said first holding part, said second holding part, said third holding part and said fourth holding part each have substrate holding mechanisms as many as m or n which is larger one.

6. The substrate processing method according to claim 4, wherein said processing part cleans a back surface of a substrate.

* * * * *